US008697590B2

(12) United States Patent
Li et al.

(10) Patent No.: US 8,697,590 B2
(45) Date of Patent: *Apr. 15, 2014

(54) LOW DIELECTRIC GLASS AND FIBER GLASS FOR ELECTRONIC APPLICATIONS

(75) Inventors: Hong Li, Sewickley, PA (US); Cheryl A. Richards, Monroeville, PA (US)

(73) Assignee: PPG Industries Ohio, Inc., Cleveland, OH (US)

( * ) Notice: Subject to any disclaimer, the term of this patent is extended or adjusted under 35 U.S.C. 154(b) by 611 days.

This patent is subject to a terminal disclaimer.

(21) Appl. No.: 12/940,764

(22) Filed: Nov. 5, 2010

(65) Prior Publication Data

US 2011/0053755 A1 Mar. 3, 2011

Related U.S. Application Data

(63) Continuation of application No. 11/610,761, filed on Dec. 14, 2006, now Pat. No. 7,829,490.

(51) Int. Cl.
*C03C 3/091* (2006.01)
*C03C 13/00* (2006.01)
*C03C 13/06* (2006.01)

(52) U.S. Cl.
USPC .............................. 501/66; 501/35; 501/36

(58) Field of Classification Search
USPC ............................................. 501/35, 36, 66
See application file for complete search history.

(56) References Cited

U.S. PATENT DOCUMENTS

| | | | |
|---|---|---|---|
| 3,008,841 A | 11/1961 | Tiede | |
| 4,582,748 A | 4/1986 | Eastes et al. | |
| 4,824,806 A | 4/1989 | Yokoi et al. | |
| 5,348,916 A | 9/1994 | Kushitani et al. | |
| 5,958,808 A | 9/1999 | Mori et al. | |
| 6,060,168 A | 5/2000 | Kohli | |
| 6,169,047 B1 | 1/2001 | Nishizawa et al. | |
| 6,537,937 B1 | 3/2003 | Nishizawa et al. | |
| 6,846,761 B2 | 1/2005 | Tamura | |
| 6,858,552 B2 | 2/2005 | Peuchert | |
| 6,867,158 B2 | 3/2005 | Peuchert et al. | |
| 7,727,916 B2 | 6/2010 | Peuchert et al. | |
| 7,754,631 B2 | 7/2010 | Maehara et al. | |
| 7,829,490 B2 * | 11/2010 | Li et al. ............... | 501/66 |
| 8,129,299 B2 | 3/2012 | Kishimoto et al. | |
| 2003/0054936 A1 | 3/2003 | Tamura | |
| 2004/0175557 A1 | 9/2004 | Creux et al. | |
| 2004/0220039 A1 | 11/2004 | Peuchert | |
| 2005/0101469 A1 | 5/2005 | Peuchert et al. | |
| 2006/0003884 A1 | 1/2006 | Nishizawa et al. | |
| 2006/0160691 A1 | 7/2006 | Kawaguchi et al. | |
| 2007/0213194 A1 | 9/2007 | Abensour et al. | |
| 2008/0146430 A1 | 6/2008 | Li et al. | |
| 2009/0170684 A1 | 7/2009 | Kato et al. | |
| 2011/0318561 A1 | 12/2011 | Murata et al. | |
| 2012/0058878 A1 * | 3/2012 | Li et al. ............... | 501/38 |
| 2012/0060678 A1 | 3/2012 | Peters et al. | |
| 2012/0060679 A1 | 3/2012 | Peters et al. | |
| 2012/0064788 A1 | 3/2012 | Peters et al. | |
| 2012/0095149 A1 | 4/2012 | Sawanoi et al. | |
| 2013/0029830 A1 | 1/2013 | Koyama et al. | |
| 2013/0037105 A1 | 2/2013 | Aitken et al. | |

FOREIGN PATENT DOCUMENTS

| | | |
|---|---|---|
| DE | 14 96 520 | 8/1969 |
| DE | 10 2005 019 958 A1 | 11/2006 |
| EP | 0 344 693 | 12/1989 |
| EP | 0831072 | 6/1996 |
| GB | 1 006 524 | 10/1965 |
| JP | 6-211543 | 8/1994 |
| JP | 6-219780 | 8/1994 |
| JP | 7-010598 | 1/1995 |
| JP | 3409806 | 1/1995 |
| JP | 2002080240 | 3/2002 |
| JP | 2002 137937 | 5/2002 |
| JP | 2002137938 | 5/2002 |
| JP | 2002154843 | 5/2002 |
| JP | 2002-220255 | 8/2002 |
| JP | 2002-338295 | 11/2002 |
| JP | 2003-137590 | 5/2003 |
| JP | 2003-171143 | 6/2003 |
| JP | 2003-321247 | 11/2003 |
| JP | 2009-286686 A | 12/2009 |
| WO | WO 99/52833 | 10/1999 |

OTHER PUBLICATIONS

Lowenstein, K., Glass Science and Technology 6, The Manufacturing technology of Continuous Glass Fibres, , Third, completely revised edition, 1993, pp. 33 & 113.
Matsumoto, M. et al., New Low Dielectric Glass (NE-Glass) Fiber Woven Materials for Next Generation Board, ECWC 8, Tokyo 99, P2-3-1 thru P2-3-4.
Navias, L. et al., Dielectric Properties of Glasses at Ultra-High Frequencies and their Relation to Composition, Journal of American Ceramic Society, 1946, vol. 29, No. 10, pp. 267-276.
E, R, and D Glass Properties, Technical Data Sheet, Saint-Gobain Vetrotex, 2002.
Search Results for International Application No. PCT/US2007/082337 dated Feb. 5, 2008.
Written Opinion of the International Searching Authority for International Application No. PCT/US2007/082337 dated Feb. 5, 2008.
International Preliminary Report on Patentability for International Application PCT/US2007/082337 dated Jun. 16, 2009.
United States Patent and Trademark Office, Amendment and Response to Office Action, U.S. Appl. No. 13/229,012, filed Oct. 22, 2013.
United States Patent and Trademark Office, Office Action, U.S. Appl. No. 13/229,012, mailed Apr. 24, 2013.
United States Patent and Trademark Office, Office Action, U.S. Appl. No. 13/232,316, mailed Apr. 29, 2013.
United States Patent and Trademark Office, Amendment and Response to Office Action, U.S. Appl. No. 13/232,316, dated Nov. 26, 2013.
United States Patent and Trademark Office, U.S. Appl. No. 13/232,316, mailed Feb. 10, 2014.
United States Patent and Trademark Office, Notice of Allowance and Fees Due, U.S. Appl. No. 13/229,012, mailed Dec. 3, 2013.

* cited by examiner

*Primary Examiner* — Karl Group
*Assistant Examiner* — Elizabeth A Bolden
(74) *Attorney, Agent, or Firm* — Andrew C. Siminerio

(57) ABSTRACT

Glass compositions are provided that are useful in electronic applications, e.g., as reinforcements in printed circuit board substrates. Reduced dielectric constants are provided relative to E-glass, and fiber forming properties are provided that are more commercially practical than D-glass.

20 Claims, No Drawings

LOW DIELECTRIC GLASS AND FIBER GLASS FOR ELECTRONIC APPLICATIONS

CROSS REFERENCE TO RELATED APPLICATION

This application is a continuation of prior application Ser. No. 11/610,761, filed on Dec. 14, 2006, which is hereby incorporated by reference in its entirety.

BACKGROUND OF THE INVENTION

This invention relates to glass compositions that are adapted for formation into fibers that can be employed for reinforcing composite substrates comprising a printed circuit board ("PCB"). More particularly, the invention relates to glass fiber reinforcements that have electrical properties that permit enhancing performance of a PCB.

"$D_k$" is the dielectric constant of a material, also known as "permittivity" and is a measure of the ability of a material to store electric energy. A material to be used as a capacitor desirably has a relatively high $D_k$, whereas a material to be used as part of a PCB substrate desirably has a low $D_k$, particularly for high speed circuits. $D_k$ is the ratio of the charge that would be stored (i.e., the capacitance) of a given material between two metal plates to the amount of charge that would be stored by a void (air or vacuum) between the same two metal plates. "$D_f$" or dissipation factor is the measure of the loss of power in a dielectric material. $D_f$ is the ratio of the resistive loss component of the current to the capacitive component of current, and is equal to the tangent of the loss angle. For high speed circuitry, it is desired that the $D_f$ of materials comprising a PCB substrate be relatively low.

PCB's have commonly been reinforced with glass fibers of the "E-glass" family of compositions, which is based on "Standard Specification for Glass Fiber Strands" D 578 American Society for Testing and Materials. By this definition, E-glass for electronic applications contains 5 to 10 weight percent $B_2O_3$, which reflects recognition of the desirable effect of $B_2O_3$ on dielectric properties of glass compositions. E-glass fibers for electronic applications typically have $D_k$ in the range 6.7-7.3 at 1 MHz frequency. Standard electronic E-glass is also formulated to provide melting and forming temperatures conducive to practical manufacturing. Forming temperatures (the temperature at which the viscosity is 1000 poise), also referred to herein as $T_F$, for commercial electronic E-glass are typically in the range of 1170° C.-1250° C.

High performance printed circuit boards require substrate reinforcements having lower $D_k$ compared to E-glass for better performance, i.e., less noise signal transmission, for applications in telecommunication and electronic computing. Optionally, reducing $D_f$ relative to E-glass is also desired by the electronic industry. While the PCB industry has a need for low dielectric fiber glass, manufacture of glass fiber reinforcement requires economical viability issues to be addressed in order for low dielectric fibers to achieve successful commercialization. To this end, some low $D_k$ glass compositions proposed in the prior art do not adequately address the economic issues.

Some low dielectric glasses in the prior art are characterized by high $SiO_2$ content or high $B_2O_3$ content, or a combination of both high $SiO_2$ and high $B_2O_3$. An example of the latter is known as "D-glass." Detailed information on this approach to low $D_k$ glass can be found in an article by L. Navias and R. L. Green, "Dielectric Properties of Glasses at Ultra-High Frequencies and their Relation to Composition," J. Am. Ceram. Soc., 29, 267-276 (1946), in U.S. Patent Application 2003/0054936 A1 (S. Tamura), and in patent application JP 3409806 B2 (Y. Hirokazu). Fibers of $SiO_2$ and glasses of the D-glass type have been used as reinforcement in fabric form for PCB substrates, e.g., laminates comprised of woven fibers and epoxy resin. Although both of those approaches successfully provide low $D_k$, sometimes as low as about 3.8 or 4.3, the high melting and forming temperatures of such compositions result in undesirably high costs for such fibers. D-glass fibers typically require forming temperatures in excess of 1400° C., and $SiO_2$ fibers entail forming temperatures on the order of about 2000° C. Furthermore, D-glass is characterized by high $B_2O_3$ content, as much as 20 weight percent or greater. Since $B_2O_3$ is one of the most costly raw materials required for manufacturing conventional electronic E-glass, the use of much greater amounts of $B_2O_3$ in D-glass significantly increases its cost compared to E-glass. Therefore, neither $SiO_2$ nor D-glass fibers provide a practical solution for manufacturing high performance PCB substrate materials on a large scale.

Other low dielectric fiber glasses based on high $B_2O_3$ concentrations (i.e., 11 to 25 weight percent) plus other relatively costly ingredients such as ZnO (up to 10 weight percent) and BaO (up to 10 weight percent) have been described in JP 3409806B2 (Hirokazu), with reported $D_k$ values in the 4.8-5.6 range at 1 MHz. The inclusion of BaO in these compositions is problematic because of cost as well as environmental reasons. In spite of the high concentrations of the costly $B_2O_3$ in the compositions of this reference, the fiber forming temperatures disclosed are relatively high, e.g., 1355° C.-1429° C. Similarly, other low dielectric glasses based on high $B_2O_3$ concentrations (i.e., 14-20 weight percent) plus relatively costly $TiO_2$ (up to 5 weight percent) have been described in U.S. Patent Application 2003/0054936 A1 (Tamura), with $D_k$=4.6-4.8 and dissipation factor $D_f$=0.0007-0.001 at 1 MHz. In Japanese Patent Application JP 02154843A (Hiroshi et al.) there are disclosed boron-free low dielectric glasses with $D_k$ in the range 5.2-5.3 at 1 MHz. Although these boron-free glasses provide low $D_k$ with presumably relatively low raw material cost, their disadvantage is that fiber forming temperatures at 1000 poise melt viscosity are high, between 1376° C. and 1548° C. Additionally, these boron-free glasses have very narrow forming windows (the difference between the forming temperature and the liquidus temperature), typically 25° C. or lower (in some cases negative), whereas a window of about 55° C. or higher would commonly be considered expedient in the commercial fiber glass industry.

To improve PCB performance while managing the increase in cost, it would be advantageous to provide compositions for fiber glasses that offer significant improvements of electrical properties ($D_k$ and/or $D_f$) relative to E-glass compositions, and at the same time provide practical forming temperatures lower than the $SiO_2$ and D-glass types and the other prior art approaches to low dielectric glass discussed above. To significantly lower raw material costs, it would be desirable to maintain $B_2O_3$ content less than that of D-glass, e.g., below 13 weight percent or below 12 percent. It can also be advantageous in some situations for the glass composition to fall within the ASTM definition of electronic E-glass, and thus to require no more than 10 weight percent $B_2O_3$. It would also be advantageous to manufacture low $D_k$ glass fibers without requiring costly materials such as BaO or ZnO that are unconventional in the fiber glass industry. In addition, commercially practical glass compositions desirably have tolerance to impurities in raw materials, which also permits the use of less costly batch materials.

Since an important function of glass fiber in PCB composites is to provide mechanical strength, improvements in electrical properties would best be achieved without significantly sacrificing glass fiber strength. Glass fiber strength can be expressed in terms of Young's modulus or pristine tensile strength. It would also be desirable if new low dielectric fiber glass solutions would be used to make PCB without requiring major changes in the resins used, or at least without requiring substantially more costly resins, as would be required by some alternative approaches.

SUMMARY OF THE INVENTION

The fiberizable glass compositions of this invention provide improved electrical performance (i.e., low $D_k$ and/or low $D_f$) relative to standard E-glass, while providing temperature-viscosity relationships that are more conducive to commercially practical fiber forming than prior art low $D_k$ glass proposals. Another optional aspect of the invention is that at least some of the compositions can be made commercially with relatively low raw material batch cost. In one aspect of the invention, glass compositions comprise the following constituents, which may be in the form of glass fibers:

| | |
|---|---|
| $SiO_2$ | 60-68 weight percent; |
| $B_2O_3$ | 7-13 weight percent; |
| $Al_2O_3$ | 9-15 weight percent; |
| MgO | 8-15 weight percent; |
| CaO | 0-4 weight percent; |
| $Li_2O$ | 0-2 weight percent; |
| $Na_2O$ | 0-1 weight percent; |
| $K_2O$ | 0-1 weight percent; |
| $Fe_2O_3$ | 0-1 weight percent; |
| $F_2$ | 0-1 weight percent; |
| $TiO_2$ | 0-2 weight percent. |

In some embodiments, the compositions of the invention are characterized by relatively low content of CaO, for example on the order of about 0-4 weight percent. In yet other embodiments, the CaO content can be on the order of about 0-3 weight percent. In general, minimizing the CaO content yields improvements in electrical properties, and the CaO content has been reduced to such low levels in some embodiments that it can be considered an optional constituent. On the other hand, the MgO content is relatively high for glasses of this type, wherein in some embodiments the MgO content is double that of the CaO content (on a weight percent basis). Some embodiments of the invention can have MgO content greater than about 6.0 weight percent, and in other embodiments the MgO content can be greater than 7.0 weight percent.

As noted above, some low $D_k$ compositions of the prior art have the disadvantage of requiring the inclusion of substantial amounts of BaO, and it can be noted that BaO is not required in the glass compositions of the present invention. Although the advantageous electrical and manufacturing properties of the invention do not preclude the presence of BaO, the absence of deliberate inclusions of BaO can be considered an additional advantage of some embodiments of the present invention. Thus, embodiments of the present invention can be characterized by the presence of less than 1.0 weight percent BaO. In those embodiments in which only trace impurity amounts are present, the BaO content can be characterized as being no more than 0.05 weight percent.

The compositions of the invention include $B_2O_3$ in amounts less that the prior art approaches that rely upon high $B_2O_3$ to achieve low $D_k$. This results in significant cost savings. In some embodiments the $B_2O_3$ content need be no more than 13 weight percent, or no more than 12 weight percent. Some embodiments of the invention also fall within the ASTM definition of electronic E-glass, i.e., no more than 10 weight percent $B_2O_3$.

In the composition set forth above, the constituents are proportioned so as to yield a glass having a dielectric constant lower than that of standard E-glass. With reference to a standard electronic E-glass for comparison, this may be less than about 6.7 at 1 MHz frequency. In other embodiments, the dielectric constant ($D_k$) may be less than 6 at 1 MHz frequency. In other embodiments, the dielectric constant ($D_k$) may be less than 5.8 at 1 MHz frequency. Further embodiments exhibit dielectric constants ($D_k$) less than 5.6 or even lower at 1 MHz frequency.

The compositions set forth above possess desirable temperature-viscosity relationships conducive to practical commercial manufacture of glass fibers. In general, lower temperatures are required for making fibers compared to the D-glass type of composition in the prior art. The desirable characteristics may be expressed in a number of ways, and they may be attained by the compositions of the present invention singly or in combination. In general, glass compositions within the ranges set forth above can be made that exhibit forming temperatures ($T_F$) at 1000 poise viscosity no greater than 1370° C. The $T_F$ of some embodiments are no greater than 1320° C., or no greater than 1300° C., or no greater than 1290° C. These compositions also encompass glasses in which the difference between the forming temperature and the liquidus temperature ($T_L$) is positive, and in some embodiments the forming temperature is at least 55° C. greater than the liquidus temperature, which is advantageous for commercial manufacturing of fibers from these glass compositions.

In general, minimizing alkali oxide content of the glass compositions assists lowering $D_k$. In those embodiments in which it is desired to optimize reduction of $D_k$ the total alkali oxide content is no more than 2 weight percent of the glass composition. In compositions of the present invention it has been found that minimizing $Na_2O$ and $K_2O$ are more effective in this regard than $Li_2O$. The presence of alkali oxides generally results in lower forming temperatures. Therefore, in those embodiments of the invention in which providing relatively low forming temperatures is a priority, $Li_2O$ is included in significant amounts, e.g. at least 0.4 weight percent. For this purpose, in some embodiments the $Li_2O$ content is greater than either the $Na_2O$ or $K_2O$ contents, and in other embodiments the $Li_2O$ content is greater than the sum of the $Na_2O$ and $K_2O$ contents, in some embodiments greater by a factor of two or more.

In addition to or instead of the features of the invention described above, the compositions of the present invention can be utilized to provide glasses having dissipation factors ($D_f$) lower than standard electronic E-glass. In some embodiments $D_F$ is no more than 0.0150 at 1 GHz, and in other embodiments no more than 0.0100 at 1 GHz.

One advantageous aspect of the invention present in some of the embodiments is reliance upon constituents that are conventional in the fiber glass industry and avoidance of substantial amounts of constituents whose raw material sources are costly. For this aspect of the invention, constituents in addition to those explicitly set forth in the compositional definition of the glasses of the present invention may be included even though not required, but in total amounts no greater than 5 weight percent. These optional constituents include melting aids, fining aids, colorants, trace impurities and other additives known to those of skill in glassmaking. Relative to some prior art low $D_k$ glasses, no BaO is required in the compositions of the present invention, but inclusions of minor amounts of BaO (e.g., up to about 1 weight percent) would not be precluded. Likewise, major amounts of ZnO are not required in the present invention, but in some embodiments minor amounts (e.g., up to about 2.0 weight percent) may be included. In those embodiments of the invention in which optional constituents are minimized, the total of optional constituents is no more than 2 weight percent, or no more than 1 weight percent. Alternatively, some embodiments of the invention can be said to consist essentially of the named constituents.

DETAILED DESCRIPTION

To lower $D_k$ and $D_f$, including $SiO_2$ and $B_2O_3$, which have low electrical polarizability, is useful in the compositions of the present invention. Although $B_2O_3$ by itself can be melted at a low temperature (350° C.), it is not stable against moisture attack in ambient air and hence, a fiber of pure $B_2O_3$ is not practical for use in PCB laminates. Both $SiO_2$ and $B_2O_3$ are network formers, and the mixture of two would result in significantly higher fiber forming temperature than E-glass, as is the case with D-glass. To lower fiber-forming temperature, MgO and $Al_2O_3$ are included, replacing some of the $SiO_2$. Calcium oxide (CaO) and SrO can be also used in combination with MgO, although they are less desirable than MgO because both have higher polarizability than MgO.

To lower batch cost, $B_2O_3$ is utilized at lower concentrations than in D-glass. However, sufficient $B_2O_3$ is included to prevent phase separation in glass melts, thereby providing better mechanical properties for glass fibers made from the compositions.

The choice of batch ingredients and their cost are significantly dependent upon their purity requirements. Typical commercial ingredients, such as for E-glass making, contain impurities of $Na_2O$, $K_2O$, $Fe_2O_3$ or FeO, SrO, $F_2$, $TiO_2$, $SO_3$, etc. in various chemical forms. A majority of the cations from these impurities would increase the $D_k$ of the glasses by forming nonbridging oxygens with $SiO_2$ and/or $B_2O_3$ in the glass.

Sulfate (expressed as $SO_3$) may also be present as a refining agent. Small amounts of impurities may also be present from raw materials or from contamination during the melting processes, such as SrO, BaO, $Cl_2$, $P_2O_5$, $Cr_2O_3$, or NiO (not limited to these particular chemical forms). Other refining agents and/or processing aids may also be present such as $As_2O_3$, MnO, $MnO_2$, $Sb_2O_3$, or $SnO_2$, (not limited to these particular chemical forms). These impurities and refining agents, when present, are each typically present in amounts less than 0.5% by weight of the total glass composition. Optionally, elements from rare earth group of the Periodic Table of the Elements may be added to compositions of the present invention, including atomic numbers 21 (Sc), 39 (Y), and 57 (La) through 71 (Lu). These may serve as either processing aids or to improve the electrical, physical (thermal and optical), mechanical, and chemical properties of the glasses. The rare earth additives may be included with regard for the original chemical forms and oxidization states. Adding rare earth elements is considered optional, particularly in those embodiments of the present invention having the objective of minimizing raw material cost, because they would increase batch costs even at low concentrations. In any case, their costs would typically dictate that the rare earth components (measured as oxides), when included, be present in amounts no greater than about 0.1-1.0% by weight of the total glass composition.

The invention will be illustrated through the following series of specific embodiments. However, it will be understood by one of skill in the art that many other embodiments are contemplated by the principles of the invention.

The glasses in these examples were made by melting mixtures of reagent grade chemicals in powder form in 10% Rh/Pt crucibles at the temperatures between 1500° C. and 1550° C. (2732° F.-2822° F.) for four hours. Each batch was about 1200 grams. After the 4-hour melting period, the molten glass was poured onto a steel plate for quenching. To compensate volatility loss of $B_2O_3$ (typically about 5% in laboratory batch melting condition for the 1200 gram batch size), the boron retention factor in the batch calculation was set at 95%. Other volatile species, such as fluoride and alkali oxides, were not adjusted in the batches for their emission loss because of their low concentrations in the glasses. The compositions in the examples represent as-batched compositions. Since reagent chemicals were used in preparing the glasses with an adequate adjustment of $B_2O_3$, the as-batched compositions illustrated in the invention are considered to be close to the measured compositions.

Melt viscosity as a function of temperature and liquidus temperature were determined by using ASTM Test Method C965 "Standard Practice for Measuring Viscosity of Glass Above the Softening Point," and C829 "Standard Practices for Measurement of Liquidus Temperature of Glass by the Gradient Furnace Method," respectively.

A polished disk of each glass sample with 40 mm diameter and 1-1.5 mm thickness was used for electrical property and mechanical property measurements, which were made from annealed glasses. Dielectric constant ($D_k$) and dissipation factor ($D_f$) of each glass were determined from 1 MHz to 1 GHz by ASTM Test Method D150 "Standard Test Methods for A-C Loss Characteristics and Permittivity (Dielectric Constant) of Solid Electrical Insulating Materials." According to the procedure, all samples were preconditioned at 25° C. under 50% humidity for 40 hours. Selective tests were performed for glass density using ASTM Test Method C729 "Standard Test Method for Density of Glass by the Sink-Float Comparator," for which all samples were annealed.

For selected compositions, a microindentation method was used to determine Young's modulus (from the initial slope of the curve of indentation loading—indentation depth, in the indenter unloading cycle), and microhardness (from the maximum indentation load and the maximum indentation depth). For the tests, the same disk samples, which had been tested for $D_k$ and $D_f$, were used. Five indentation measurements were made to obtain average Young's modulus and microhardness data. The microindentation apparatus was calibrated using a commercial standard reference glass block with a product name BK7. The reference glass has Young's modulus 90.1 GPa with one standard deviation of 0.26 GPa and microhardness 4.1 GPa with one standard deviation of 0.02 GPa, all of which were based on five measurements.

All compositional values in the examples are expressing in weight percent.

Table 1 Compositions

Examples 1-8 provide glass compositions (Table 1) by weight percentage: $SiO_2$ 62.5-67.5%, $B_2O_3$ 8.4-9.4%, $Al_2O_3$ 10.3-16.0%, MgO 6.5-11.1%, CaO 1.5-5.2%, $Li_2O$ 1.0%, $Na_2O$ 0.0%, $K_2O$ 0.8%, $Fe_2O_3$ 0.2-0.8%, $F_2$ 0.0%, $TiO_2$ 0.0%, and sulfate (expressed as $SO_3$) 0.0%.

The glasses were found to have $D_k$ of 5.44-5.67 and Df of 0.0006-0.0031 at 1 MHz, and $D_k$ of 5.47-6.67 and $D_f$ of 0.0048-0.0077 at 1 GHz frequency. The electric properties of the compositions in Series III illustrate significantly lower (i.e., improved) $D_k$ and $D_f$ over standard E-glass with $D_k$ of 7.29 and $D_f$ of 0.003 at 1 MHz and $D_k$ of 7.14 and $D_f$ of 0.0168 at 1 GHz.

In terms of fiber forming properties, the compositions in Table 1 have forming temperatures ($T_F$) of 1300-1372° C. and forming windows ($T_F$-$T_L$) of 89-222° C. This can be compared to a standard E-glass which has $T_F$ typically in the range 1170-1215° C. To prevent glass devitrification in fiber forming, a forming window ($T_F$-$T_L$) greater than 55° C. is desirable. All of the compositions in Table 1 exhibit satisfactory forming windows. Although the compositions of Table 1 have higher forming temperatures than E-glass, they have significantly lower forming temperatures than D-glass (typically about 1410° C.).

In terms of mechanical properties, the compositions of Table 2 have Young's modulus of 86.5-91.5 GPa and microhardness of 4.0-4.2 GPa, both of which are equal or higher than standard E glass that has Young's modulus of 85.9 GPa and microhardness of 3.8 GPa. The Young's moduli of the

TABLE 1

| | EXAMPLE: | | | | | | | |
|---|---|---|---|---|---|---|---|---|
| | 1 | 2 | 3 | 4 | 5 | 6 | 7 | 8 |
| $Al_2O_3$ | 11.02 | 9.45 | 11.64 | 12.71 | 15.95 | 10.38 | 10.37 | 11.21 |
| $B_2O_3$ | 8.55 | 8.64 | 8.58 | 8.56 | 8.46 | 8.71 | 9.87 | 9.28 |
| CaO | 5.10 | 5.15 | 3.27 | 2.48 | 1.50 | 2.95 | 2.01 | 1.54 |
| CoO | 0.00 | 0.00 | 0.00 | 0.00 | 0.00 | 0.00 | 0.00 | 0.62 |
| $Fe_2O_3$ | 0.39 | 0.40 | 0.39 | 0.39 | 0.39 | 0.53 | 0.80 | 0.27 |
| $K_2O$ | 0.77 | 0.78 | 0.77 | 0.77 | 0.76 | 0.79 | 0.79 | 0.78 |
| $Li_2O$ | 0.98 | 0.99 | 0.98 | 0.98 | 0.97 | 1.00 | 1.00 | 1.00 |
| MgO | 6.70 | 7.44 | 8.04 | 8.69 | 9.24 | 10.39 | 11.05 | 11.04 |
| $SiO_2$ | 66.48 | 67.16 | 66.32 | 65.42 | 62.72 | 65.26 | 64.12 | 64.26 |
| Properties | | | | | | | | |
| $D_k$, 1 MHz | 5.62 | 5.59 | 5.44 | 5.47 | 5.50 | 5.67 | 5.57 | 5.50 |
| $D_k$, 1 GHz | 5.65 | 5.62 | 5.46 | 5.47 | 5.53 | 5.67 | 5.56 | 5.50 |
| $D_f$, 1 MHz | 0.0010 | 0.0006 | 0.0016 | 0.0008 | 0.0020 | 0.0031 | 0.0012 | 0.0010 |
| $D_f$, 1 GHz | 0.0048 | 0.0059 | 0.0055 | 0.0051 | 0.0077 | 0.0051 | 0.0053 | 0.0049 |
| $T_L$ (° C.) | 1209 | 1228 | 1215 | 1180 | 1143 | 1219 | 1211 | 1213 |
| $T_F$ (° C.) | 1370 | 1353 | 1360 | 1372 | 1365 | 1319 | 1300 | 1316 |
| $T_F - T_L$ (° C.) | 161 | 125 | 145 | 192 | 222 | 100 | 89 | 103 |

Table 2 Compositions

Examples 9-15 provide glass compositions: $SiO_2$ 60.8-68.0%, $B_2O_3$ 8.6 and 11.0%, $Al_2O_3$ 8.7-12.2%, MgO 9.5-12.5%, CaO 1.0-3.0%, $Li_2O$ 0.5-1.5%, $Na_2O$ 0.5%, $K_2O$ 0.8%, $Fe_2O_3$ 0.4%, $F_2$ 0.3%, $TiO_2$ 0.2%, and sulfate (expressed as $SO_3$) 0.0%.

The glasses were found to have $D_k$ of 5.55-5.95 and $D_f$ of 0.0002-0.0013 at 1 MHz, and $D_k$ of 5.54-5.94 and $D_f$ of 0.0040-0.0058 at 1 GHz frequency. The electric properties of the compositions in Table 2 illustrate significantly lower (improved) $D_k$ and $D_f$ over standard E-glass with $D_k$ of 7.29 and $D_f$ of 0.003 at 1 MHz, and $D_k$ of 7.14 and $D_f$ of 0.0168 at 1 GHz.

compositions in the Table 2 are also significantly higher than D-glass which is about 55 GPa based on literature data.

In terms of fiber forming properties, the compositions of Table 2 have forming temperature ($T_F$) of 1224-1365° C., and forming windows ($T_F$-$T_L$) of 6-105° C. as compared to standard E-glass having $T_F$ in the range 1170-1215° C. Some, but not all, of the Table 2 compositions have a forming window ($T_F$-$T_L$) greater than 55° C., which is considered preferable in some circumstances to avoid glass devitrification in commercial fiber forming operations. The Table 2 compositions have lower forming temperatures than those of D-glass (1410° C.), although higher than E-glass.

TABLE 2

| | EXAMPLE: | | | | | | |
|---|---|---|---|---|---|---|---|
| | 9 | 10 | 11 | 12 | 13 | 14 | 15 |
| $Al_2O_3$ | 12.02 | 11.88 | 10.41 | 12.08 | 12.18 | 8.76 | 12.04 |
| $B_2O_3$ | 10.98 | 10.86 | 9.90 | 8.71 | 8.79 | 8.79 | 8.68 |
| CaO | 1.07 | 2.90 | 2.02 | 2.95 | 1.09 | 1.09 | 2.94 |
| $F_2$ | 0.32 | 0.31 | 0.32 | 0.32 | 0.32 | 0.32 | 0.32 |
| $Fe_2O_3$ | 0.40 | 0.39 | 0.40 | 0.40 | 0.40 | 0.40 | 0.40 |
| $K_2O$ | 0.78 | 0.77 | 0.79 | 0.79 | 0.79 | 0.79 | 0.78 |
| $Li_2O$ | 0.50 | 0.49 | 1.00 | 0.50 | 1.51 | 1.51 | 1.49 |
| MgO | 12.35 | 9.56 | 11.10 | 12.41 | 12.51 | 9.81 | 9.69 |
| $Na_2O$ | 0.51 | 0.51 | 0.52 | 0.52 | 0.52 | 0.52 | 0.52 |
| $SiO_2$ | 60.87 | 62.13 | 63.35 | 61.14 | 61.68 | 67.80 | 62.95 |
| $TiO_2$ | 0.20 | 0.20 | 0.20 | 0.20 | 0.20 | 0.20 | 0.20 |
| Properties | | | | | | | |
| $D_k$, 1 MHz | 5.69 | 5.55 | 5.74 | 5.84 | 5.95 | 5.60 | 5.88 |
| $D_k$, 1 GHz | 5.65 | 5.54 | 5.71 | 5.83 | 5.94 | 5.55 | 5.86 |
| $D_f$, 1 MHz | 0.0007 | 0.0013 | 0.0007 | 0.0006 | 0.0002 | 0.0002 | 0.0011 |
| $D_f$, 1 GHz | 0.0042 | 0.0040 | 0.0058 | 0.0043 | 0.0048 | 0.0045 | 0.0053 |
| $T_L$ (° C.) | 1214 | 1209 | 1232 | 1246 | 1248 | 1263 | 1215 |
| $T_F$ (° C.) | 1288 | 1314 | 1287 | 1277 | 1254 | 1365 | 1285 |
| $T_F - T_L$ (° C.) | 74 | 105 | 55 | 31 | 6 | 102 | 70 |
| E (GPa) | 90.5 | 87.4 | 86.8 | 86.5 | 89.6 | 87.2 | 91.5 |
| H (GPa) | 4.12 | 4.02 | 4.02 | 4.03 | 4.14 | 4.07 | 4.19 |

TABLE 3

| | EXAMPLES: | | | | |
|---|---|---|---|---|---|
| | 16 | 17 | 18 | 19 | 20 |
| $Al_2O_3$ | 10.37 | 11.58 | 8.41 | 11.58 | 12.05 |
| $B_2O_3$ | 8.71 | 10.93 | 10.66 | 8.98 | 8.69 |
| CaO | 2.01 | 2.63 | 3.02 | 1.78 | 2.12 |
| $F_2$ | 0.32 | 0.30 | 0.30 | 0.30 | 0.30 |
| $Fe_2O_3$ | 0.40 | 0.27 | 0.27 | 0.27 | 0.27 |
| $K_2O$ | 0.79 | 0.25 | 0.25 | 0.16 | 0.10 |
| $Li_2O$ | 0.50 | 1.21 | 1.53 | 0.59 | 1.40 |
| MgO | 11.06 | 10.04 | 9.65 | 11.65 | 10.57 |
| $Na_2O$ | 0.52 | 0.25 | 0.57 | 0.35 | 0.15 |
| $SiO_2$ | 65.13 | 62.55 | 65.35 | 64.35 | 64.35 |
| $TiO_2$ | 0.20 | 0.00 | 0.00 | 0.00 | 0.00 |
| Total | 100.00 | 100.00 | 100.00 | 100.00 | 100.00 |
| $D_k$, 1 MHz | 5.43 | 5.57 | | 5.30 | 5.42 |
| $D_k$, 1 GHz | 5.33 | 5.48 | | 5.22 | 5.33 |
| $D_f$, 1 MHz | 0.0057 | 0.0033 | | 0.0031 | 0.0051 |
| $D_f$, 1 GHz | 0.0003 | 0.0001 | | 0.0008 | 0.0014 |
| $T_L$ (°C.) | 1231 | 1161 | 1196 | 1254 | 1193 |
| $T_F$ (°C.) | 1327 | 1262 | 1254 | 1312 | 1299 |
| $T_F - T_L$ (°C.) | 96 | 101 | 58 | 58 | 106 |
| $T_M$ (°C.) | 1703 | 1592 | 1641 | 1634 | 1633 |
| E (GPa) | 85.3 | 86.1 | 85.7 | 91.8 | 89.5 |
| Std E (GPa) | 0.4 | 0.6 | 2.5 | 1.7 | 1.5 |
| H (GPa) | 3.99 | 4.00 | 4.03 | 4.22 | 4.13 |
| Std H (GPa) | 0.01 | 0.02 | 0.09 | 0.08 | 0.05 |

| | EXAMPLES: | | | | | |
|---|---|---|---|---|---|---|
| | 21 | 22 | 23 | 24 | 25 | 26 |
| $Al_2O_3$ | 12.04 | 12.04 | 12.04 | 12.04 | 12.04 | 12.54 |
| $B_2O_3$ | 8.65 | 8.69 | 10.73 | 10.73 | 11.07 | 8.73 |
| CaO | 2.06 | 2.98 | 2.98 | 2.98 | 2.98 | 2.88 |
| $F_2$ | 0.45 | 0.45 | 0.45 | 0.45 | 0.45 | 2.00 |
| $Fe_2O_3$ | 0.35 | 0.35 | 0.35 | 0.35 | 0.35 | 0.35 |
| $K_2O$ | 0.4 | 0.4 | 0.4 | 0.4 | 0.4 | 0.40 |
| $Li_2O$ | 1.53 | 1.05 | 1.05 | 0.59 | 0.48 | |
| MgO | 10.47 | 10.62 | 9.97 | 11.26 | 11.26 | 11.26 |
| $Na_2O$ | 0.5 | 0.5 | 0.5 | 0.5 | 0.5 | 0.50 |
| $SiO_2$ | 63.05 | 62.42 | 61.03 | 60.2 | 59.97 | 61.34 |
| $TiO_2$ | 0.5 | 0.5 | 0.5 | 0.5 | 0.5 | |
| Total | 100.00 | 100.00 | 100.00 | 100.00 | 100.00 | 100.00 |
| $D_k$, 1 MHz | 5.75 | 5.73 | 5.61 | 5.64 | 5.63 | 5.35 |
| $D_k$, 1 GHz | 5.68 | 5.61 | 5.55 | 5.54 | 5.49 | 5.38 |
| $D_f$, 1 MHz | 0.004 | 0.0058 | 0.0020 | 0.0046 | 0.0040 | 0.0063 |
| $D_f$, 1 GHz | 0.0021 | 0.0024 | 0.0034 | 0.0019 | 0.0023 | 0.0001 |
| $T_L$ (°C.) | 1185 | 1191 | 1141 | 1171 | 1149 | 1227 |
| $T_F$ (°C.) | 1256 | 1258 | 1244 | 1246 | 1249 | 1301 |
| $T_F - T_L$ (°C.) | 71 | 67 | 103 | 75 | 100 | |
| $T_M$ (°C.) | 1587 | 1581 | 1587 | 1548 | 1553 | |
| E (GPa) | | | | | | |
| Std E (GPa) | | | | | | |
| H (GPa) | | | | | | |
| Std H (GPa) | | | | | | |
| $\sigma_f$ (KPSI/GPa) | | | 475.7/ 3.28 | 520.9/ 3.59 | 466.5/ 3.22 | 522.0 |
| Std $\sigma_f$ (KPSI/GPa) | | | 37.3/ 0.26 | 18.3/ 0.13 | 41.8/ 0.29 | 18.70 |
| Density (g/cm³) | | | 2.4209* | 2.4324* | 2.4348* | |

TABLE 4

| | EXAMPLE: | | |
|---|---|---|---|
| | 27 | 28 | E-Glass |
| $Al_2O_3$ | 12.42 | 12.57 | 13.98 |
| $B_2O_3$ | 9.59 | 8.59 | 5.91 |
| CaO | 0.11 | 0.10 | 22.95 |
| $F_2$ | 0.35 | 0.26 | 0.71 |
| $Fe_2O_3$ | 0.21 | 0.21 | 0.36 |
| $K_2O$ | 0.18 | 0.18 | 0.11 |
| $Li_2O$ | 0.80 | 1.01 | 0 |
| MgO | 10.25 | 10.41 | 0.74 |
| $Na_2O$ | 0.15 | 0.18 | 0.89 |
| $SiO_2$ | 65.47 | 65.96 | 54.15 |
| $TiO_2$ | 0.17 | 0.17 | 0.07 |
| $D_k$, 1 MHz | 5.3 | 5.4 | 7.3 |

TABLE 4-continued

| | EXAMPLE: | | |
|---|---|---|---|
| | 27 | 28 | E-Glass |
| $D_k$, 1 GHz | 5.3 | 5.4 | 7.1 |
| $D_f$, 1 MHz | 0.003 | 0.008 | |
| $D_f$, 1 GHz | 0.011 | 0.012 | 0.0168 |
| $T_L$ (° C.) | 1184 | 1201 | 1079 |
| $T_F$ (° C.) | 1269 | 1282 | 1173 |
| $T_F - T_L$ (° C.) | 85 | 81 | 94 |
| E (GPa) | | | |
| H (GPa) | 3.195 | 3.694 | |

That which is claimed is:

1. A glass composition suitable for fiber forming comprising:

| | |
|---|---|
| $SiO_2$ | 60-68 weight percent; |
| $B_2O_3$ | 7-12 weight percent; |
| $Al_2O_3$ | 9-14 weight percent; |
| MgO | 8-14 weight percent; |
| CaO | 0-4 weight percent; |
| $Li_2O$ | 0-2 weight percent; |
| $Na_2O$ | 0-1 weight percent; |
| $K_2O$ | 0-1 weight percent; |
| $Fe_2O_3$ | 0-1 weight percent; |
| $F_2$ | 0-2 weight percent; |
| $TiO_2$ | 0-2 weight percent; and |
| other constituents | 0-5 weight percent total; | wherein the ($Li_2O+Na_2O+K_2O$) content is no more than 2 weight percent and wherein the MgO content is at least twice the content of CaO on a weight percent basis.

2. The composition of claim 1 wherein the CaO content is 0-3 weight percent.

3. The composition of claim 1 wherein the MgO content is 8-13 weight percent.

4. The composition of claim 1 wherein the MgO content is 9-12 weight percent.

5. The composition of claim 1 wherein the $B_2O_3$ content is no more than 11 weight percent.

6. The composition of claim 1 wherein the $Al_2O_3$ content is 10-13 weight percent.

7. The composition of claim 1 wherein the constituents are selected to provide a glass having a dielectric constant ($D_k$) less than 6.7 at 1 MHz frequency.

8. The composition of claim 1 wherein the constituents are selected to provide a glass having a dielectric constant ($D_k$) less than 6 at 1 MHz frequency.

9. The composition of claim 1 wherein the constituents are selected to provide a glass having a dielectric constant ($D_k$) less than 5.8 at 1 MHz frequency.

10. The composition of claim 1 wherein the constituents are selected to provide a glass having a dielectric constant ($D_k$) less than 5.6 at 1 MHz frequency.

11. The composition of claim 1 wherein the constituents are selected to provide a forming temperature $T_F$ at 1000 poise viscosity no greater than 1370° C.

12. The composition of claim 11 wherein the constituents are selected to provide a liquidus temperature $T_L$ at least 55° C. below the forming temperature.

13. The composition of claim 1 wherein the constituents are selected to provide a forming temperature $T_F$ at 1000 poise viscosity no greater than 1320° C.

14. The composition of claim 13 wherein the constituents are selected to provide a liquidus temperature $T_L$ at least 55° C. below the forming temperature.

15. The composition of claim 1 wherein the composition comprises 0-1 weight percent of BaO and 0-2 weight percent ZnO.

16. The composition of claim 1 wherein the composition comprises essentially no BaO and essentially no ZnO.

17. The composition of claim 1 wherein other constituents, if any, are present in a total amount of 0-2 weight percent.

18. The composition of claim 1 wherein other constituents, if any, are present in a total amount of 0-1 weight percent.

19. A glass composition suitable for fiber forming comprising:

| | |
|---|---|
| $B_2O_3$ | less than 12 weight percent; |
| $Al_2O_3$ | 9-14 weight percent; |
| MgO | 8-14 weight percent; |
| CaO | 0-4 weight percent; |
| $SiO_2$ | 60-68 weight percent; |
| $Li_2O$ | 0-2 weight percent; |
| $Na_2O$ | 0-1 weight percent; |
| $K_2O$ | 0-1 weight percent; |
| $Fe_2O_3$ | 0-1 weight percent; |
| $F_2$ | 0-2 weight percent; and |
| $TiO_2$ | 0-2 weight percent; | wherein the ($Li_2O+Na_2O+K_2O$) content is no more than 2 weight percent, wherein the MgO content is at least twice the content of CaO on a weight percent basis, and wherein the glass exhibits a dielectric constant ($D_k$) less than 6.7 and forming temperature ($T_F$) at 1000 poise viscosity no greater than 1370° C.

20. A glass composition suitable for fiber forming comprising:

| | |
|---|---|
| $SiO_2$ | 60-68 weight percent; |
| $B_2O_3$ | 7-12 weight percent; |
| $Al_2O_3$ | 9-14 weight percent; |
| MgO | 8-14 weight percent; |
| CaO | 0-3 weight percent; |
| $Li_2O$ | 0-2 weight percent; |
| $Na_2O$ | 0-1 weight percent; |
| $K_2O$ | 0-1 weight percent; |
| $Fe_2O_3$ | 0-1 weight percent; |
| $F_2$ | 0-2 weight percent; and |
| $TiO_2$ | 0-2 weight percent; | wherein the ($Li_2O+Na_2O+K_2O$) content is no more than 2 weight percent, wherein the MgO content is at least twice the content of CaO on a weight percent basis, and wherein the glass exhibits a dielectric constant ($D_k$) less than 5.9 and forming temperature ($T_F$) at 1000 poise viscosity no greater than 1320° C.

* * * * *